(12) United States Patent
Lee et al.

(10) Patent No.: US 10,079,252 B2
(45) Date of Patent: Sep. 18, 2018

(54) DISPLAY APPARATUS

(71) Applicant: Innolux Corporation, Miao-Li County (TW)

(72) Inventors: Kuan-Feng Lee, Miao-Li County (TW); Jui-Jen Yueh, Miao-Li County (TW); Yi-An Chen, Miao-Li County (TW); Kai Cheng, Miao-Li County (TW); Fang-Ying Lin, Miao-Li County (TW); Tsau-Hua Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 10 days.

(21) Appl. No.: 15/598,327

(22) Filed: May 18, 2017

(65) Prior Publication Data

US 2017/0358604 A1 Dec. 14, 2017

Related U.S. Application Data

(60) Provisional application No. 62/350,169, filed on Jun. 14, 2016, provisional application No. 62/371,246, filed on Aug. 5, 2016.

(30) Foreign Application Priority Data

Jan. 18, 2017 (CN) .......................... 2017 1 0037608

(51) Int. Cl.
*H01L 27/12* (2006.01)
*H01L 33/58* (2010.01)
*H01L 33/44* (2010.01)
*G06F 3/044* (2006.01)

(52) U.S. Cl.
CPC ............ *H01L 27/124* (2013.01); *G06F 3/044* (2013.01); *H01L 33/44* (2013.01); *H01L 33/58* (2013.01)

(58) Field of Classification Search
CPC ....... H01L 27/124; H01L 33/58; H01L 33/44; G06F 3/044; B32B 2457/208
See application file for complete search history.

(56) References Cited

U.S. PATENT DOCUMENTS

| | | | | |
|---|---|---|---|---|
| 2014/0061597 | A1* | 3/2014 | Choi | H01L 51/5284 257/40 |
| 2014/0125884 | A1* | 5/2014 | Wang | G06F 3/0412 349/12 |
| 2014/0339495 | A1* | 11/2014 | Bibl | H01L 33/504 257/13 |
| 2014/0367633 | A1* | 12/2014 | Bibl | G02F 1/133603 257/13 |
| 2014/0367711 | A1* | 12/2014 | Bibl | H01L 24/24 257/89 |
| 2017/0162553 | A1* | 6/2017 | Bibl | H01L 25/167 |
| 2017/0269749 | A1* | 9/2017 | Bok | G06F 3/0412 |

* cited by examiner

*Primary Examiner* — Latanya N Crawford
(74) *Attorney, Agent, or Firm* — JCIPRNET

(57) ABSTRACT

A display apparatus includes an array substrate, a light emitting element, and a light shielding layer. The light emitting element is disposed on the array substrate and includes a first upper surface. The light shielding layer is disposed on a periphery of the light emitting element and includes a second upper surface. A distance between the first upper surface and the second upper surface in a direction perpendicular to the array substrate is between 0 and 5 μm.

20 Claims, 11 Drawing Sheets

DISPLAY APPARATUS

CROSS-REFERENCE TO RELATED APPLICATION

This application claims the priority benefits of U.S. provisional application Ser. No. 62/350,169, filed on Jun. 14, 2016, U.S. provisional application Ser. No. 62/371,246, filed on Aug. 5, 2016, and Chinese application serial no. 201710037608.5, filed on Jan. 18, 2017. The entirety of each of the above-mentioned patent applications is hereby incorporated by reference herein and made a part of this specification.

BACKGROUND

1. Technical Field

The present disclosure relates to an apparatus, and in particular, relates to a display apparatus.

2. Description of Related Art

Because light emitting diode (LED) display apparatuses have advantages such as active light emitting, high brightness, high contrast ratio, and low power consumption, in recent years, they have become one of technologies, which are vigorously developed, of new displays. To satisfy the requirement of high resolution, LED display apparatuses are developing towards the direction of being formed by an active element array substrate and LEDs that have the micrometer size and are arranged in an array.

SUMMARY

The present disclosure provides a display apparatus, which can improve the problem of mutual interference between light emitted by light emitting elements.

The display apparatus of the present disclosure comprises an array substrate, a light emitting element, and a light shielding layer. The light emitting element is disposed on the array substrate and comprises a first upper surface. The light shielding layer is disposed on a periphery of the light emitting element and comprises a second upper surface. A distance between the first upper surface and the second upper surface in a direction perpendicular to the array substrate is between 0 and 5 μm.

In order to make the aforementioned and other objectives and advantages of the present disclosure comprehensible, embodiments accompanied with figures are described in detail below.

DESCRIPTION OF THE EMBODIMENTS

Figure 1:
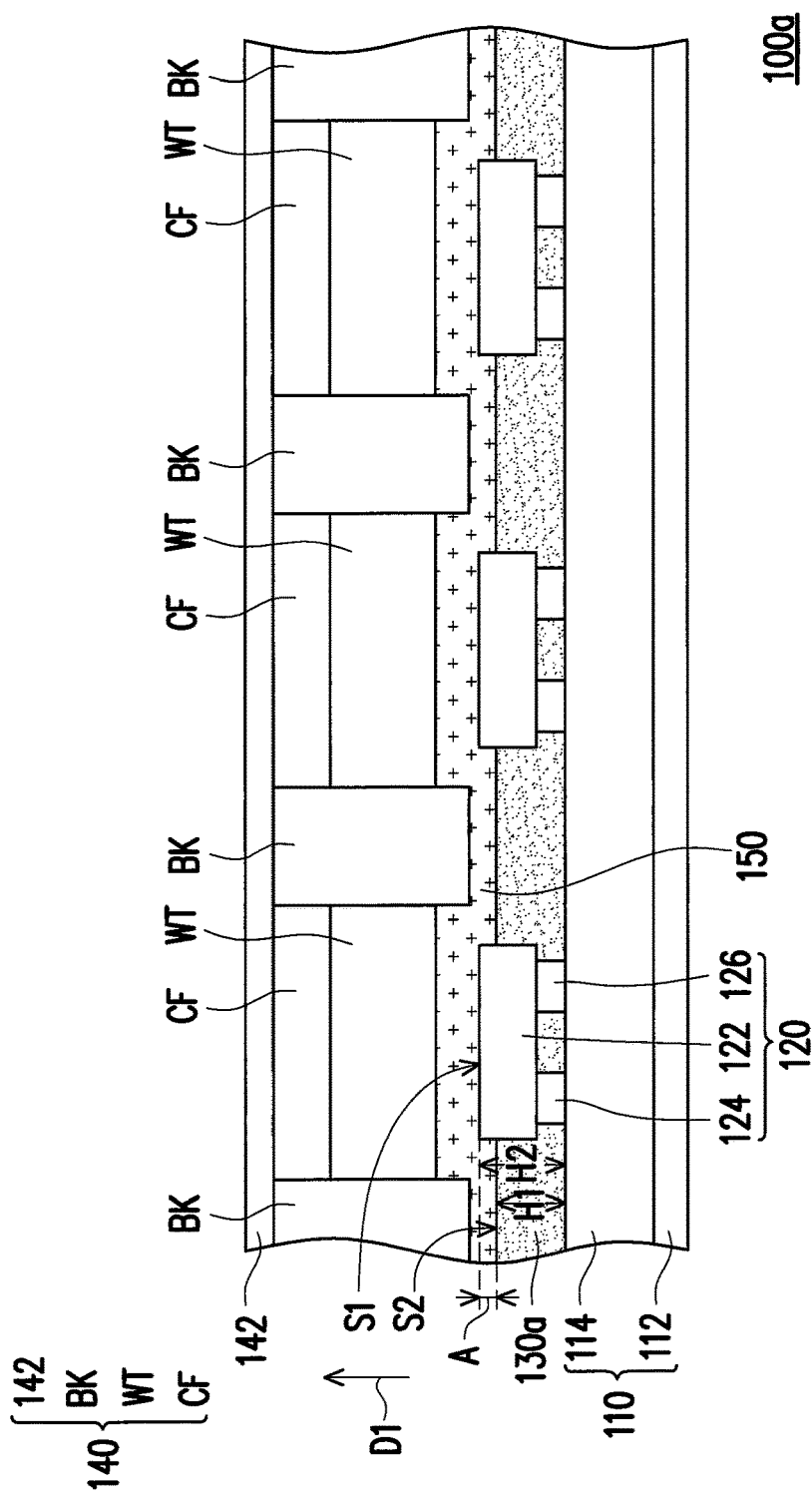
FIG. 1 is a schematic cross-sectional view of a part of a display apparatus of a first embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

In the present specification, the description of forming another structure above or on a structure may include an embodiment of forming direct contact between the structure and the another structure, and may also include an embodiment of forming an additional structure between the structure and the another structure so that the structure may not get in direct contact with the another structure.

To provide a display apparatus that can improve the problem of mutual interference between light emitted by light emitting elements, the present disclosure provides a display apparatus that comprises a light shielding layer. The light shielding layer is disposed on a periphery of a light emitting element, and a height H1 of the light shielding layer and a height H2 of the light emitting element satisfy the following relations: $\frac{1}{2} \times H2 \leq H1 \leq H2 + 5$ μm or $\frac{1}{2} \times H2 \leq H1 \leq 2 \times H2$, or there is a distance between 0 and 5 μm between an upper surface of the light emitting element and an upper surface of the light shielding layer in a direction perpendicular to an array substrate. Various embodiments are listed below to describe the display apparatus of the present disclosure in detail as examples based on which the present disclosure can be actually implemented.

FIG. 1 is a schematic cross-sectional view of a part of a display apparatus of a first embodiment of the present disclosure. Referring to FIG. 1, in the present embodiment, a display apparatus 100*a* comprises an array substrate 110, a plurality of light emitting elements 120, and a light shielding layer. In the present embodiment, the light shielding layer is exemplified by a filling material 130*a*. In addition, in the present embodiment, the display apparatus 100*a* may further comprise an opposite substrate 140 and an optical seal layer 150.

In the present embodiment, the array substrate 110 comprises a first substrate 112 and an element layer 114 disposed on the first substrate 112. The material of the first substrate 112 may be glass, quartz, an organic polymer, a metal, or the like. In the present embodiment, the element layer 114, for example, is an active element layer, and can be configured to drive a plurality of light emitting elements 120. On such basis, the element layer 114 may be any active element layer well known to any person of ordinary skill in the art. For example, in an embodiment, the element layer 114 may be formed by at least one insulation layer, at least one conductive layer, or a combination thereof. Specifically, in an embodiment, the element layer 114, for example, may comprise a plurality of scan lines, a plurality of data lines, a plurality of transistors, a plurality of electrodes, and a plurality of capacitors. From another point of view, in an embodiment, the array substrate 110, for example, is an active element array substrate. In another embodiment, the array substrate 110, for example, is a thin film transistor (TFT) array substrate.

The plurality of light emitting elements 120 may be disposed on the array substrate 110. It is worth mentioning that although FIG. 1 discloses three light emitting elements 120, any person of ordinary skill in the art should understand that the plurality of light emitting elements 120 may be arranged, in an array, on the array substrate 110. The plurality of light emitting elements 120 may be located between the array substrate 110 and the opposite substrate 140. In the present embodiment, the light emitting elements 120, for example, are flip chip LEDs. However, the present disclosure is not limited thereto. In other embodiments, the light emitting elements 120 may also be vertical LEDs or organic LEDs. Specifically, the light emitting elements 120 may be red light LEDs, green light LEDs, blue light LEDs, or LEDs with other colors. That is, specifically, the light emitting elements 120 may emit light with different colors, or emit light with the same color. On the other hand, in an embodiment, the light emitting elements 120 may be LEDs with micrometer-level sizes, and lengths and widths thereof may be respectively less than or equal to 300 μm and greater than or equal to 1 μm. In other embodiments, lengths and widths of the light emitting elements 120 may further be respectively less than or equal to 100 μm and greater than or equal to 2 μm, less than or equal to 20 μm and greater than or equal to 3 μm, or less than or equal to 10 μm and greater than or equal to 5 μm.

In detail, in the present embodiment, the light emitting element 120 may comprise a light emitting structure 122, an electrode 124, and an electrode 126, where the electrode 124 and the electrode 126 are disposed on the element layer 114 in a separated manner, and the light emitting structure 122 is disposed on the electrode 124 and the electrode 126. The light emitting structure 122 may be any light emitting structure well known to any person of ordinary skill in the art. For example, in an embodiment, the light emitting structure 122, for example, may comprise a P type semiconductor layer, a multiple quantum well structure, and an N type semiconductor layer. The electrode 124 and the electrode 126 respectively may be any electrode well known to any person of ordinary skill in the art. For example, in an embodiment, the electrode 124, for example, is a P type electrode, and the electrode 126, for example, is an N type electrode.

On the other hand, in the present embodiment, the light emitting elements 120 may be driven by the element layer 114 of the array substrate 110. In detail, in the present embodiment, the light emitting elements 120 are electrically connected to the element layer 114 in a flip chip manner, so that the element layer 114 can drive the light emitting elements 120. Therefore, a manner of electrical connection between the light emitting elements 120 and the element layer 114 may be implemented by any connection manner well known to any person of ordinary skill in the art. For example, in an embodiment, the light emitting elements 120 may be electrically connected to a source/drain (not drawn) and a common electrode (not drawn) of a transistor (not drawn) in the array substrate 110 by means of a conductive structure (not drawn).

The filling material 130a may be disposed on the array substrate 110. The filling material 130a is disposed among a plurality of light emitting elements 120 and may be disposed on a periphery of each of the light emitting elements 120. In detail, in an embodiment, there is a distance A between an upper surface S1 of the light emitting elements 120 and an upper surface S2 of the filling material 130a in a direction D1 perpendicular to the array substrate 110, and the distance A is between 0 and 5 μm. In another embodiment, the distance A is between 0 and 3 μm. From another point of view, in an embodiment, a height H1 of the filling material 130a and a height H2 of the light emitting elements 120 satisfy the following relation: ½×H2≤H1≤H2+5 μm, where units of the height H1 and the height H2 are both μm. In another embodiment, the height H1 and the height H2 satisfy the following relation: ½×H2≤H1≤2×H2. That is, the height H1 of the filling material 130a may be greater than, equal to, or less than the height H2 of the light emitting elements 120. On such basis, although FIG. 1 discloses that the height H1 of the filling material 130a is less than the height H2 of the light emitting elements 120, it is only a specific embodiment to describe the present disclosure, and it is not intended to limit the scope of the present disclosure in any manner. In addition, it is worth mentioning that in the embodiment of FIG. 1, if H1 is less than ½×H2, then the filling material 130a cannot shield lateral light emitted by the light emitting elements 120 and a light mixing problem occurs; if H1 is greater than H2+5 μm or 2×H2, then subsequent manufacturing procedures are difficult, for example, filing and leveling up degree is poor and adhesion is poor. On the other hand, if the distance A exceeds the foregoing range, the foregoing light mixing problem or the problem that subsequent manufacturing procedures are difficult may occur.

In the present specification, a height H2 of the light emitting elements 120 is defined as a total height of a combination of the light emitting structure 122, the electrode 124, and the electrode 126. In an embodiment, the height H2 of the light emitting elements 120, for example, is between 1 μm and 20 μm. In another embodiment, the height H2 of the light emitting elements 120, for example, is between 2 μm and 12 μm. In still another embodiment, the height H2 of the light emitting elements 120, for example, is between 3 μm and 8 μm. In addition, in an embodiment, the height H1 of the filling material 130a, for example, is between 1 μm and 20 μm.

In addition, in the present embodiment, the optical density of the filling material 130a is between 0 density/pin and 5 density/μm. That is, the filling material 130a may have high opacity. In this way, in the display apparatus 100a, the height H1 of the filling material 130a and the height H2 of the light emitting elements 120 satisfy the following relations: ½×H2≤H1≤H2+5 μm or ½×H2≤H1≤2×H2, or in the direction D1, there is the distance A between 0 and 5 μm between the upper surface S1 of the light emitting elements 120 and the upper surface S2 of the filling material 130a, and thereby the filling material 130a can shield lateral light emitted by the light emitting elements 120. As a result, light with different colors emitted by adjacent light emitting elements 120 does not interfere with each other, and therefore the color mixing problem can be avoided. In addition, to make the light emitting elements 120 maintain suitable light emitting brightness while preventing the color mixing problem, in an embodiment, the height H1 of the filling material 130a and the height H2 of the light emitting elements 120 satisfy the following relation: H2−2 μm≤H1≤H2+2 μm; in another embodiment, the height H1 of the filling material 130a is substantively flush to the height H2 of the light emitting elements 120; or in still another embodiment, the filling material 130a does not extend to cover the light emitting elements 120.

In addition, in the present embodiment, the filling material 130a has good filing and leveling up degree. In detail, in the present embodiment, the filling material 130a not only can fill up gaps among the light emitting elements 120, but also can fill up a gap between the light emitting elements 120 and the array substrate 110, and gets in contact with the light emitting elements 120. In this way, in the display apparatus 100a, by configuring the filling material 130a among a plurality of light emitting elements 120 to get in contact with the light emitting elements 120 and fill up the gap between the light emitting elements 120 and the array substrate 110, the effects of fixing the light emitting elements 120, reducing the possibility that the light emitting elements 120 get in contact with water vapors and reducing the contact area can be achieved, thereby improving the reliability of the light emitting elements 120.

In addition, in the present embodiment, the filling material 130a, for example, is (but not limited to): an acrylic photoresist, an epoxy-based adhesive material, or a macromolecular filing material.

The opposite substrate 140 is set opposite to the array substrate 110. In detail, in the present embodiment, the opposite substrate 140 may comprise a second substrate 142, a light shielding pattern layer BK disposed on the second substrate 142, a plurality of color filter patterns CF and a plurality of wavelength conversion patterns WT. However, the present disclosure is not limited thereto. In other embodiments, only the color filter patterns CF or only the wavelength conversion patterns WT may be disposed on the second substrate 142. In other embodiments, the opposite substrate 140 may comprise only the second substrate 142.

The material of the second substrate 142 may be glass, quartz, an organic polymer, a metal, or the like. The light shielding pattern layer BK is disposed on the second substrate 142, and is set corresponding to an adjacent color filter pattern CF (related description will be described below). In detail, in the present embodiment, the light shielding pattern layer BK can be configured to shield elements and wirings, which are not intended to be seen by a user, in the element layer 114 of the array substrate 110, for example, scan lines, data lines, and transistors. Therefore, any person of ordinary skill in the art should understand that in space, the light shielding pattern layer BK can be overlapping with the scan lines, the data lines, the transistors, and the like in the element layer 114. In addition, the light shielding pattern layer BK, for example, is a black matrix (BM). In addition, the material of the light shielding pattern layer BK, for example, includes (but is not limited to): black resin, other colored resin, a black photoresist, other colored photoresists, a metal, or a single-layer or multi-layer structure formed by the foregoing materials.

A plurality of color filter patterns CF is disposed on the second substrate 142, and is set corresponding to the light emitting elements 120, so as to adjust chromaticity of color light emitted by the light emitting elements 120. The color filter patterns CF may include a red filter pattern, a green filter patter, a blue filter pattern, or filter patterns with other colors. In addition, the color filter patterns CF may be implemented by filter patterns well known to any person of ordinary skill in the art.

The multiple wavelength conversion patterns WT may be disposed on the second substrate 142 and are set corresponding to the color filter patterns CF. In detail, the material of the wavelength conversion patterns WT, for example, includes (but is not limited to): a quantum dot material, a fluorescent powder material, a phosphor powder material, or a combination of the foregoing materials.

It is worth mentioning that the opposite substrate 140 of the present embodiment comprises the light shielding pattern layer BK, the color filter patterns CF, and the wavelength conversion patterns WT disposed on the second substrate 142. However, the present disclosure is not limited thereto. In other embodiments, the opposite substrate 140 may be any opposite substrate well known to any person of ordinary skill in the art. In addition, in the present embodiment, the display apparatus 100a comprises the opposite substrate 140, but the present disclosure is not limited thereto. In other embodiments, the display apparatus 100a may not comprise the opposite substrate.

The optical seal layer 150 is disposed between the array substrate 110 and the opposite substrate 140, and can cover a plurality of light emitting elements 120. In detail, in the present embodiment, the optical seal layer 150 can fill up gaps among the opposite substrate 140, the light emitting elements 120, and the filling material 130a, and no air bubbles are generated therein. In this way, in the display apparatus 100a, by setting the optical seal layer 150, the problem that a transmittance of light emitted by the light emitting elements 120 can be decreased caused by a poor refractive index between air and the wavelength conversion patterns WT can be avoided. In addition, in the present embodiment, a method for forming the optical seal layer 150, for example, includes the following steps: forming an optical seal material layer on the array substrate 110 on which the light emitting elements 120 and the filling material 130a are formed, and then pressing the opposite substrate 140 to perform adhesion. Further, in the present embodiment, the optical seal layer 150 has the attribute of high viscosity, and therefore when the array substrate 110 is adhered to the opposite substrate 140 by means of the optical seal layer 150, good adhesion intensity can be achieved.

In addition, in the present embodiment, a thickness of the optical seal layer 150 is between 2 µm and 20 µm. In detail, if the thickness of the optical seal layer 150 is greater than 20 µm, a color mixing phenomenon will occur due to an excessively large thickness thereof. In addition, in the present embodiment, a transmittance of the optical seal layer 150 reaches 99% or the above, so that light emitted by the light emitting elements 120 can effectively transmit through the optical seal layer 150. In addition, in the present embodiment, the optical seal layer 150 may have good anti-water-vapor capacity, and therefore, the light emitting elements 120 and the wavelength conversion patterns WT can be effectively prevented from getting in contact with water vapors, so as to improve the reliability of the display apparatus 100a.

In addition, in the present embodiment, the material of the optical seal layer 150, for example, is (but is not limited to): an optical clear adhesive (OCA) or optical clear resin (OCR).

It is worth mentioning that, as stated above, in the present embodiment, the height H1 of the filling material 130a disposed on the array substrate 110 and disposed among the light emitting elements 120 and the height H2 of the light emitting elements 120 satisfy the following relations: $\frac{1}{2} \times H2 \leq H1 \leq H2+5$ µm or $\frac{1}{2} \times H2 \leq H1 \leq 2 \times H2$, or in the direction D1, there is the distance A between 0 and 5 µm between the upper surface S1 of the light emitting elements 120 and the upper surface S2 of the filling material 130a, so that light with different colors emitted by adjacent light emitting elements 120 does not interfere with each other, and therefore the color mixing problem can be avoided.

In addition, although in the embodiment of FIG. 1, the height H2 of each of the light emitting elements 120 is equal, the present disclosure is not limited thereto. In other embodiments, the plurality of the light emitting elements 120 may also have different heights H2, as long as the heights H2 of at least one of the plurality of the light emitting elements 120 satisfy the following relations: $\frac{1}{2} \times H2 \leq H1 \leq H2+5$ μm or $\frac{1}{2} \times H2 \leq H1 \leq 2 \times H2$, or there is the distance A between 0 and 5 μm between the upper surface S1 of the light emitting elements 120 and the upper surface S2 of the filling material 130a.

In addition, although in the embodiment of FIG. 1, the display apparatus 100a comprises the optical seal layer 150, the present disclosure is not limited thereto. In other embodiments, an optical seal layer may not be provided between the array substrate 110 and the opposite substrate 140.

In addition, although in the foregoing embodiment, the light shielding layer is implemented by the filling material 130a and the effect of avoiding a color mixing problem can be achieved on such basis, the present disclosure is not limited thereto. Other implementation forms will be described below with reference to FIG. 2 and FIG. 3. It must be described herein that the following embodiments still use reference numbers and partial content of the foregoing embodiment; same or similar reference numbers are used to represent same or similar elements, and descriptions of same technical content are omitted. Refer to the foregoing embodiment for descriptions of the omitted part, which is not described again in the foregoing embodiments. Differences between the embodiment of FIG. 2 and the embodiment of FIG. 1 and the differences between the embodiment of FIG. 3 and the embodiment of FIG. 1 are described below.

Figure 2:
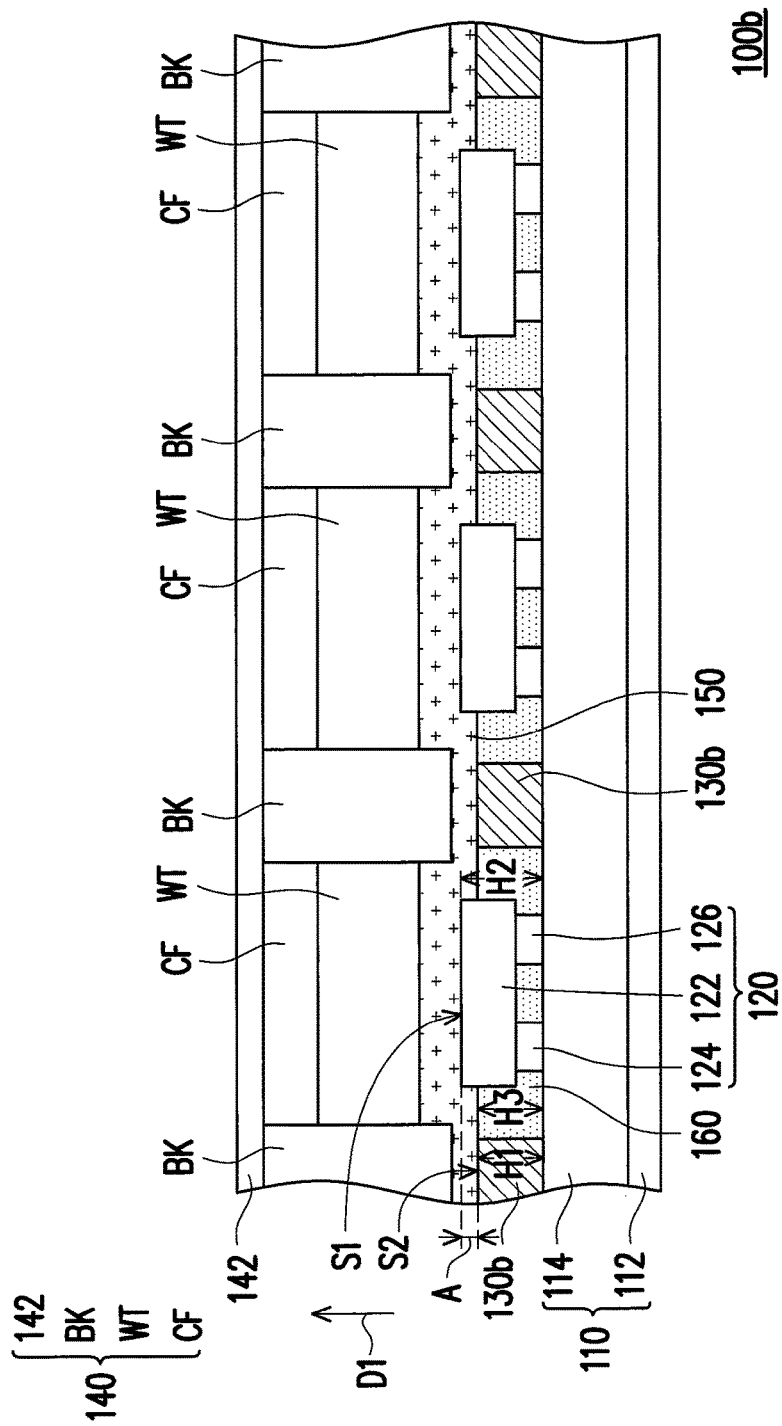
FIG. 2 is a schematic cross-sectional view of a part of a display apparatus of a second embodiment of the present disclosure.

FIG. 2 is a schematic cross-sectional view of a part of a display apparatus of a second embodiment of the present disclosure. Referring to FIG. 2 and FIG. 1, in a display apparatus 100b, a light shielding layer is implemented by a metal layer 130b. Differences between FIG. 2 and FIG. 1 will be described below.

Referring to FIG. 2, in the display apparatus 100b, a light shielding layer and an insulation layer 160 are disposed on an array substrate 110, wherein the light shielding layer is exemplified by a metal layer 130b. The metal layer 130b and the insulation layer 160 are disposed among a plurality of light emitting elements 120 and disposed on a periphery of each of the light emitting elements 120, and the insulation layer 160 is located between the metal layer 130b and the plurality of light emitting elements 120.

In the present embodiment, the material of the metal layer 130b, for example, includes (but is not limited to): a metal such as gold, silver, copper, aluminum, molybdenum, or titanium or an alloy material thereof.

It is worth describing that, as stated above, in the present embodiment, a height H1 of the metal layer 130b disposed on the array substrate 110 and disposed among the light emitting elements 120 and a height H2 of the light emitting elements 120 satisfy the following relations: $\frac{1}{2} \times H2 \leq H1 \leq H2+5$ μm or $\frac{1}{2} \times H2 \leq H1 \leq 2 \times H2$, or in a direction D1, there is a distance A between 0 and 5 μm between an upper surface S1 of the light emitting elements 120 and an upper surface S2 of the metal layer 130b, so that light with different colors emitted by adjacent light emitting elements 120 does not interfere with each other, and therefore the color mixing problem can be avoided.

In the present embodiment, the insulation layer 160 has good filing and leveling up degree. In detail, in the present embodiment, the insulation layer 160 not only can fill up gaps between the light emitting elements 120 and the metal layer 130b, but also can fill up a gap between the light emitting elements 120 and the array substrate 110, and gets in contact with the light emitting elements 120. In this way, in the display apparatus 100b, by configuring the insulation layer 160 between the metal layer 130b and a plurality of light emitting elements 120 to get in contact with the light emitting elements 120 and fill up the gap between the light emitting elements 120 and the array substrate 110, the effects of fixing the light emitting elements 120, reducing the possibility that the light emitting elements 120 get in contact with water vapors and reducing the contact area can be achieved, thereby improving the reliability of the light emitting elements 120.

In addition, in the present embodiment, a height H3 of the insulation layer 160 is substantively flush to the height H1 of the metal layer 130b. In detail, in an embodiment, the height H3 of the insulation layer 160 and the height H2 of the light emitting elements 120 satisfy the following relation: $\frac{1}{2} \times H2 \leq H3 \leq H2+5$ μm, where a unit of the height H3 is vim. In another embodiment, the height H3 and the height H2 satisfy the following relation: $\frac{1}{2} \times H2 \leq H3 \leq 2 \times H2$. In further another embodiment, the height H3 and the height H2 satisfy the following relation: $H2 \leq H3 \leq H2+5$ μm. In still another embodiment, the height H3 and the height H2 satisfy the following relation: $H2 \leq H3 \leq 2 \times H2$. That is, in the present embodiment, the height H3 of the insulation layer 160 may be greater than, equal to, or less than the height H2 of the light emitting elements 120. On such basis, although FIG. 2 discloses that the height H3 of the insulation layer 160 is less than the height H2 of the light emitting elements 120, it is only a specific embodiment to describe the present disclosure, and is not intended to limit the scope of the present disclosure in any manner. In an embodiment, the height H3 of the insulation layer 160, for example, is between 2 μm and 20 μm.

In addition, in the present embodiment, opacity of the insulation layer 160 is not particularly limited, that is, the insulation layer 160 may be transparent or have opacity. In detail, in an embodiment, if the insulation layer 160 is transparent, the insulation layer 160 can extend to cover the light emitting elements 120. However, in another embodiment, if the insulation layer 160 has opacity, the insulation layer 160 may also make light with different colors emitted by adjacent light emitting elements 120 not interfere with each other. In this case, as stated above, to avoid insufficient light emitting brightness of the light emitting elements 120, in an embodiment, the height H3 of the insulation layer 160 and the height H2 of the light emitting elements 120 satisfy the following relation: $H2-2$ μm $\leq H3 \leq H2+2$ μm; in another embodiment, the height H3 of the insulation layer 160 is substantively flush to the height H2 of the light emitting elements 120; or in still another embodiment, the insulation layer 160 does not extend to cover the light emitting elements 120.

From another point of view, the material of the insulation layer 160 is not particularly limited, and may be an insulating material that has good filling and leveling up degree well known to any person of ordinary skill in the art, for example, the material is (but is not limited to): an acrylic photoresist, an epoxy-based adhesive material, or a macromolecular filing material.

Figure 3:
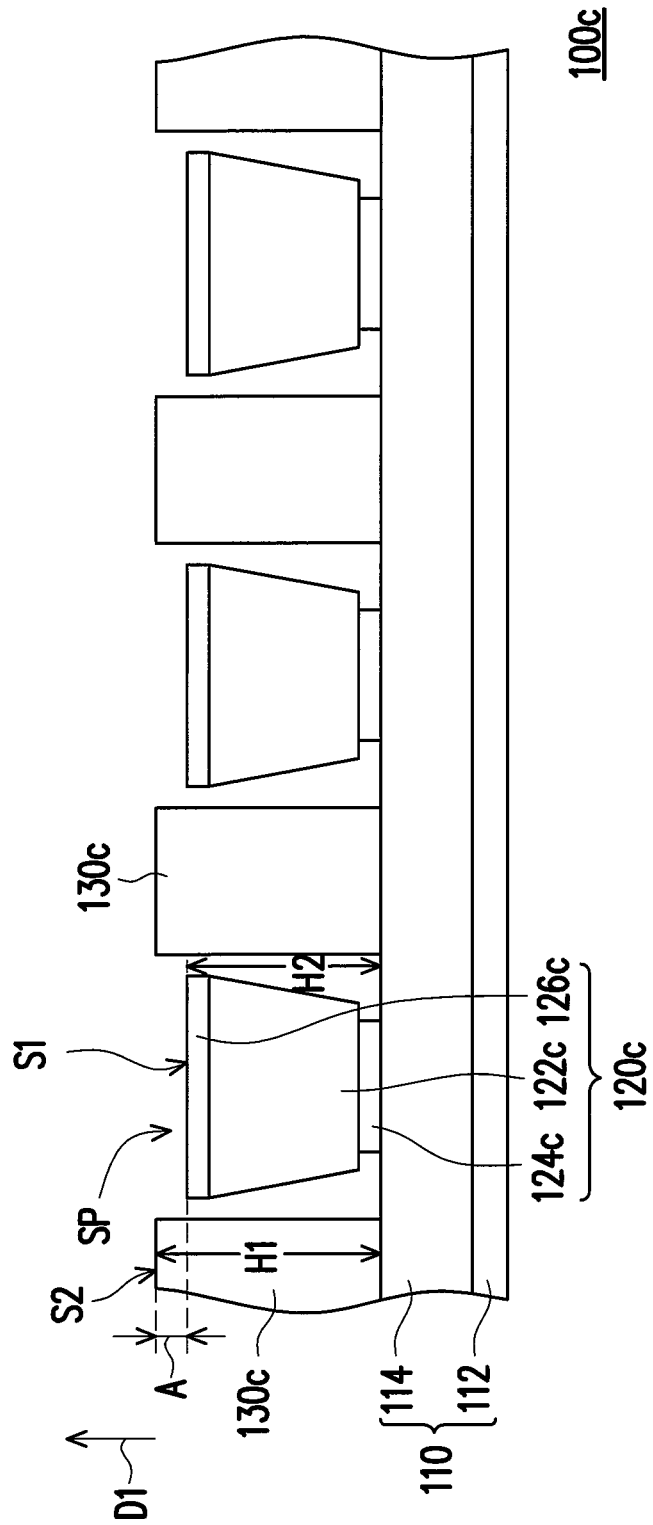
FIG. 3 is a schematic cross-sectional view of a part of a display apparatus of a third embodiment of the present disclosure.

FIG. 3 is a schematic cross-sectional view of a part of a display apparatus of a third embodiment of the present disclosure. Referring to FIG. 3, in a display apparatus 100c, a light shielding layer exemplified by a BM 130c has a plurality of accommodating spaces SP that can accommodate a plurality of light emitting elements 120. In the present embodiment, one light emitting element 120c is placed in one accommodating space SP, but the present disclosure is not limited thereto. In other embodiments, a plurality of light emitting elements 120c that emit light with the same color may also be placed in one accommodating space SP. In detail, in the present embodiment, the material of the BM 130c, for example, includes (but is not limited to): black resin or a black photoresist.

In addition, in the present embodiment, the light emitting elements 120c, for example, are vertical LEDs. However, the present disclosure is not limited thereto. In other embodiments, the light emitting elements 120c may also be flip chip LEDs or organic LEDs. Specifically, the light emitting elements 120c may be red light LEDs, green light LEDs, blue light LEDs, or LEDs with other colors. That is, specifically, the light emitting elements 120c may emit light with different colors, or emit light with the same color. On the other hand, in an embodiment, the light emitting elements 120c may be LEDs with micrometer-level sizes, and lengths and widths thereof may be respectively less than or equal to 300 μm and greater than or equal to 1 μm. In other embodiments, lengths and widths of the light emitting elements 120c may further be respectively less than or equal to 100 μm and greater than or equal to 2 μm, less than or equal to 20 μm and greater than or equal to 3 μm, or less than or equal to 10 μm and greater than or equal to 5 μm.

In detail, in the present embodiment, the light emitting element 120c may comprise a light emitting structure 122c, an electrode 124c, and an electrode 126c, where the electrode 124c is disposed on an element layer 114, and the light emitting structure 122c is located between the electrode 124c and the electrode 126c, and the electrode 126c is disposed on the light emitting structure 122c. The light emitting structure 122c may be any light emitting structure well known to any person of ordinary skill in the art. For example, in an embodiment, the light emitting structure 122c, for example, may comprise a P type semiconductor layer, a multiple quantum well structure, and an N type semiconductor layer. The electrode 124c and the electrode 126c respectively may be any electrode well known to any person of ordinary skill in the art. For example, in an embodiment, the electrode 124c, for example, is a P type electrode, and the electrode 126c, for example, is an N type electrode.

On the other hand, in the present embodiment, the light emitting elements 120c are driven by the element layer 114 of the array substrate 110. In detail, in the present embodiment, the light emitting elements 120c are electrically connected to the element layer 114, so that the element layer 114 can drive the light emitting elements 120c. Therefore, a manner of electrical connection between the light emitting elements 120c and the element layer 114 may be implemented by any connection manner well known to any person of ordinary skill in the art. For example, in an embodiment, the light emitting elements 120c may be electrically connected to a source/drain (not drawn) and a common electrode (not drawn) of a transistor (not drawn) in the array substrate 110 by means of a conductive structure (not drawn).

It is worth describing that, at stated above, in the present embodiment, a height H1 of the BM 130c disposed on the array substrate 110 and disposed among the light emitting elements 120c and a height H2 of the light emitting elements 120c satisfy the following relations: $\frac{1}{2} \times H2 \leq H1 \leq H2+5$ μm or $\frac{1}{2} \times H2 \leq H1 \leq 2 \times H2$, or in a direction D1, there is a distance A between 0 and 5 μm between an upper surface S1 of the light emitting elements 120c and an upper surface S2 of the BM 130c, so that light with different colors emitted by adjacent light emitting elements 120c does not interfere with each other, and therefore the color mixing problem can be avoided. In an embodiment, the height H2 of the light emitting elements 120c, for example, is between 1 μm and 20 μm. In another embodiment, the height H2 of the light emitting elements 120c, for example, is between 2 μm and 12 μm. In still another embodiment, the height H2 of the light emitting elements 120c, for example, is between 3 μm and 8 μm.

In addition, in the present embodiment, a method for manufacturing the display apparatus 100c, for example, includes the following steps: forming the BM 130c on the array substrate 110, and then moving and placing, by means of a pick apparatus, the light emitting elements 120c temporarily stored on the substrate into the accommodating spaces SP to assemble with the array substrate 110. The pick apparatus has a pick head, and a pick action is performed by means of the pick head. Generally, the height of the pick head, for example, is between 2 μm and 5 μm. In this way, in the present embodiment, the height H1 of the BM 130c and the height H2 of the light emitting elements 120c satisfy the following relation: $\frac{1}{2} \times H2 \leq H1 \leq H2+5$ μm, that is, the height H1 of the BM 130c is not greater than the height H2 of the light emitting elements 120c plus 5 μm, so as to avoid the problem that the light emitting elements 120c cannot be smoothly assembled with the array substrate 110 because the pick head is blocked by the BM 130c in a process of placing the light emitting elements 120c into the accommodating spaces SP by using the pick head. From another point of view, in the embodiment of FIG. 3, if H1 is greater than H2+5 μm or 2×H2, not only the pick head of the pick apparatus has difficulty in accommodating the light emitting elements 120c to assemble with the array substrate 110, but also the subsequent manufacturing procedures are difficult due to problems such as poor filling and leveling up degree and poor adhesion.

In addition, although in the embodiment of FIG. 3, the display apparatus 100c does not comprise an opposite substrate, the present disclosure is not limited thereto. In other embodiments, the display apparatus 100c may also comprise an opposite substrate assembled with the array substrate 110. The opposite substrate may be implemented by the opposite substrate 140 of FIG. 1, or the opposite substrate may be any opposite substrate well known to any person of ordinary skill in the art.

In addition, although in the embodiment of FIG. 3, the light shielding layer is implemented by the BM 130c, the present disclosure is not limited thereto. In other embodiments, the light shielding layer may also be implemented by using an insulating material well known to any person of ordinary skill in the art. The insulating material, for example, includes (but is not limited to): photodefinable acrylic resin, a photoresist, silicon oxide, silicon nitride, poly (methyl methacrylate) (PMMA), benzocyclobutene (BCB), polyimide, acrylate, epoxy resin, or polyester. Further, in a case in which the light shielding layer is implemented by the foregoing listed insulating materials, as stated above, the optical density of the insulating material is made between 0 density/μm and 5 density/μm, and the height H1 of the light shielding layer and the height H2 of the light emitting elements 120c satisfy the following relations: $\frac{1}{2} \times H2 \leq H1 \leq H2+5$ μm or $\frac{1}{2} \times H2 \leq H1 \leq 2 \times H2$, or in the direction D1, there is the distance A between 0 and 5 μm between the upper surface S1 of the light emitting elements 120c and the upper surface S2 of light shielding layer, so that light with different colors emitted by adjacent light emitting elements 120c does not interfere with each other, and therefore the color mixing problem can be avoided.

In addition, it is worth mentioning that the display apparatus of the present disclosure may have display and touch functions. Detailed description will be made below with reference to FIG. 4 to FIG. 11. It must be described herein that the following embodiments still use reference numbers and partial content of the foregoing embodiments; same or similar reference numbers are used to represent same or similar elements, and descriptions of same technical content are omitted. Refer to the foregoing embodiments for descriptions of the omitted part, which is not described again in the foregoing embodiments.

Figure 4:
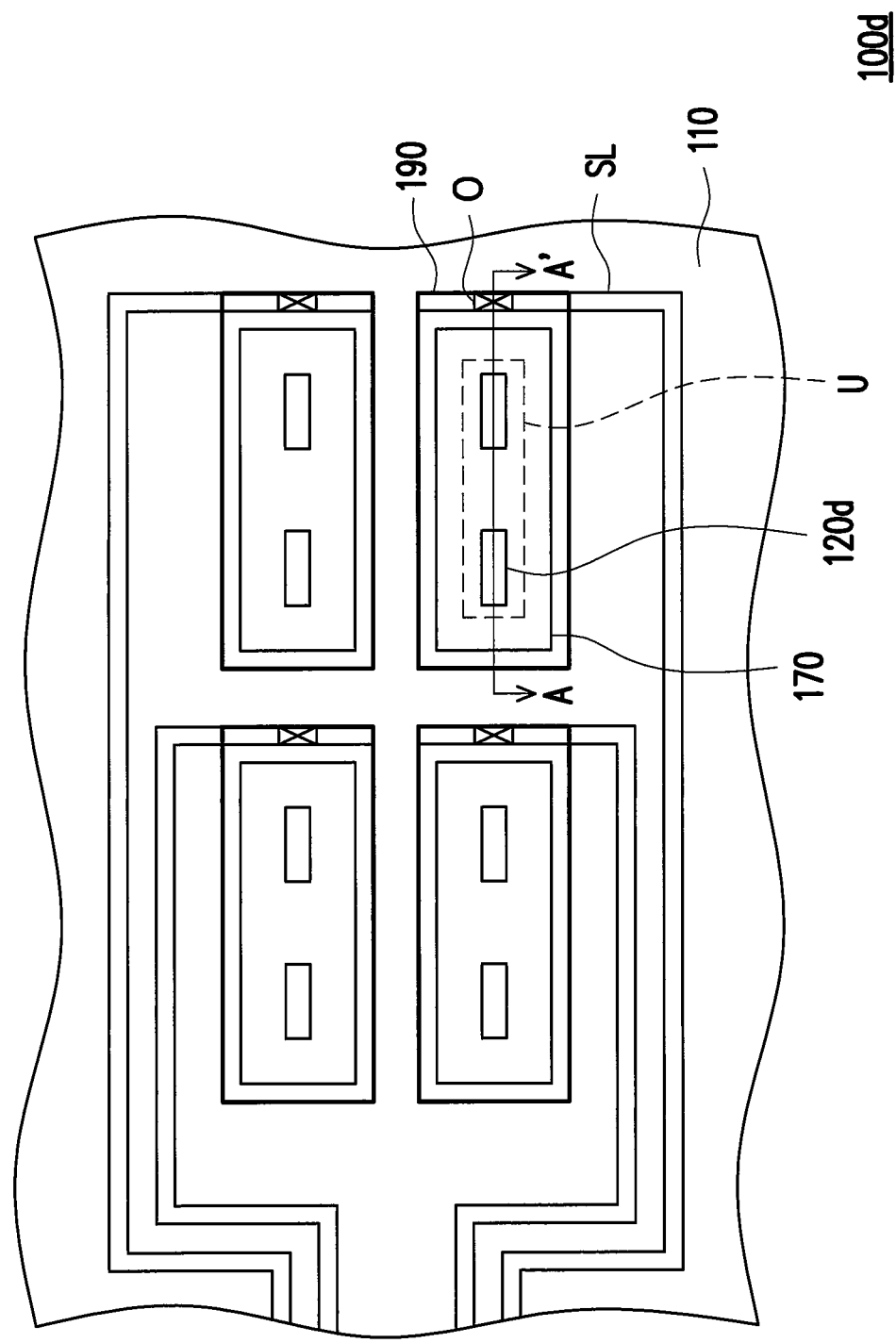
FIG. 4 is a schematic top view of a part of a display apparatus of a fourth embodiment of the present disclosure.
Figure 5:
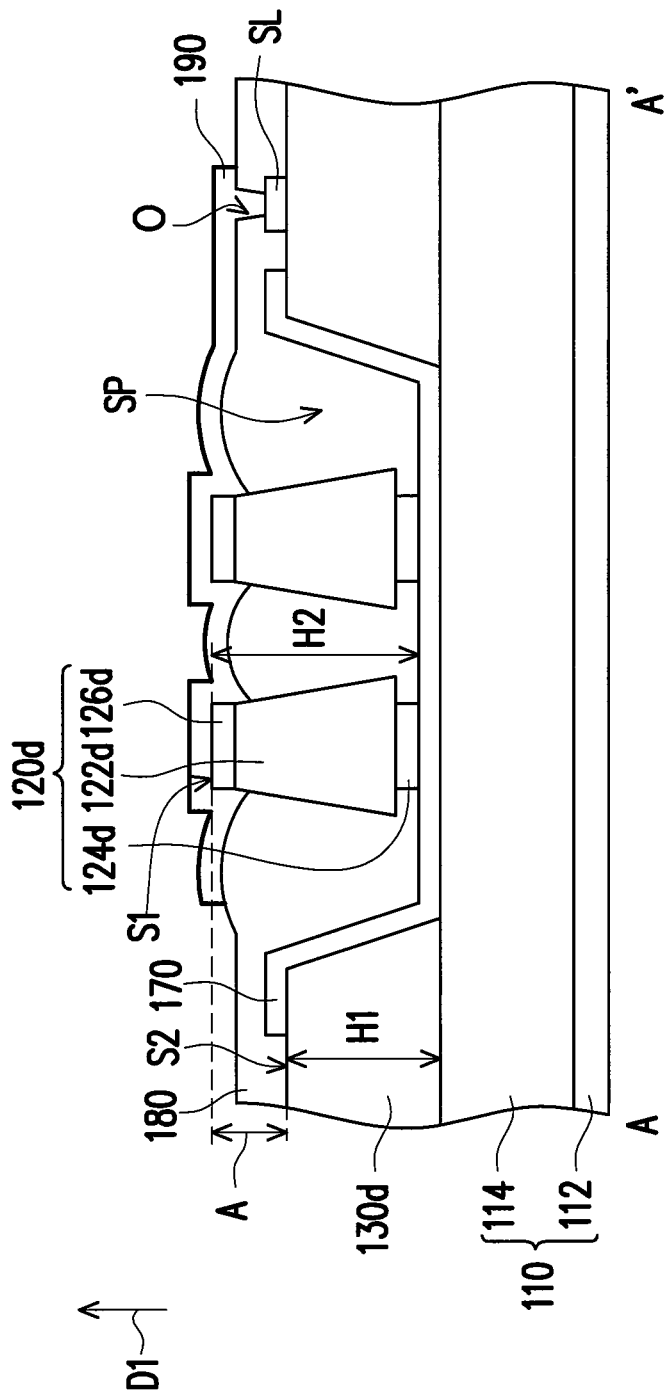
FIG. 5 is a schematic cross-sectional view along a section line A-A' in FIG. 4.

FIG. 4 is a schematic top view of a part of a display apparatus of a fourth embodiment of the present disclosure. FIG. 5 is a schematic cross-sectional view along a section line A-A' in FIG. 4.

Referring to FIG. 4 and FIG. 5 at the same time, a display apparatus 100d comprises a plurality of light emitting units U arranged in an array. Each of the light emitting units U may comprise, for example, two light emitting elements 120d. In the present embodiment, the light emitting elements 120d, for example, are vertical LEDs. However, the present disclosure is not limited thereto. In other embodiments, the light emitting elements 120d may also be flip chip LEDs or organic LEDs. Specifically, the light emitting elements 120d may be red light LEDs, green light LEDs, blue light LEDs, or LEDs with other colors. In the present embodiment, specifically, two light emitting elements 120d in each of the light emitting units U may emit light with the same color, and specifically, the light emitting units U may emit light with different colors, or emit light with the same color. On the other hand, in an embodiment, the light emitting elements 120d may be LEDs with micrometer-level sizes, and lengths and widths thereof may be respectively less than or equal to 300 μm and greater than or equal to 1 μm. In other embodiments, lengths and widths of the light emitting elements 120d may further be respectively less than or equal to 100 μm and greater than or equal to 2 μm, less than or equal to 20 μm and greater than or equal to 3 μm, or less than or equal to 10 μm and greater than or equal to 5 μm.

In detail, in the present embodiment, the light emitting element 120d may comprise a light emitting structure 122d, an electrode 124d, and an electrode 126d, where the electrode 124d is disposed on an element layer 114, and the light emitting structure 122d is located between the electrode 124d and the electrode 126d, and the electrode 126d is disposed on the light emitting structure 122d. The light emitting structure 122d may be any light emitting structure well known to any person of ordinary skill in the art. For example, in an embodiment, the light emitting structure 122d, for example, may comprise a P type semiconductor layer, a multiple quantum well structure, and an N type semiconductor layer. The electrode 124d and the electrode 126d respectively may be any electrode well known to any person of ordinary skill in the art. For example, in an embodiment, the electrode 124d, for example, is a P type electrode, and the electrode 126d, for example, is an N type electrode.

In addition, in the present embodiment, the display apparatus 100d comprises a plurality of conductive structures 170, disposed on a light shielding layer exemplified by a BM 130d and filled into accommodating spaces SP. In detail, in the present embodiment, the conductive structures 170 may be arranged in an array corresponding to the light emitting units U. In addition, the conductive structures 170 get in contact with the electrodes 124d of the light emitting elements 120d, and the array substrate 110 may be electrically connected to the light emitting elements 120d by means of the conductive structures 170, so as to drive the light emitting elements 120d. That is, in the present embodiment, one conductive structure 170 is electrically connected to one light emitting unit U. On the other hand, the material of the conductive structures 170, for example, is (but is not limited to): copper, titanium, nickel, silver, gold, indium, or another suitable conductive material.

It is worth describing that, at stated above, in the present embodiment, a height H1 of the BM 130d and a height H2 of the light emitting elements 120d satisfy the following relations: $\frac{1}{2} \times H2 \leq H1 \leq H2+5$ μm or $\frac{1}{2} \times H2 \leq H1 \leq 2 \times H2$, or in a direction D1, there is a distance A between 0 and 5 μm between an upper surface S1 of the light emitting elements 120d and an upper surface S2 of the BM 130d, so that light with different colors emitted by adjacent light emitting elements 120d does not interfere with each other, and therefore the color mixing problem can be avoided. On the other hand, according to content of the embodiment of FIG. 3, any person of ordinary skill in the art should understand that in the present embodiment, the light shielding layer may also be implemented by using an insulating material well known to any person of ordinary skill in the art. In addition, as stated above, in a case in which the light shielding layer is implemented by the insulating material, the optical density of the insulating material is made between 0 density/μm and 5 density/μm, and the height H1 of the light shielding layer and the height H2 of the light emitting elements 120d satisfy the following relations: $\frac{1}{2} \times H2 \leq H1 \leq H2+5$ μm or $\frac{1}{2} \times H2 \leq H1 \leq 2 \times H2$, or in the direction D1, there is the distance A between 0 and 5 μm between the upper surface S1 of the light emitting elements 120d and the upper surface S2 of light shielding layer, so that light with different colors emitted by adjacent light emitting elements 120d does not interfere with each other, and therefore the color mixing problem can be avoided.

In addition, in the present embodiment, the display apparatus 100d comprises a plurality of signal lines SL, disposed on the BM 130d and set corresponding to the light emitting units U. In detail, in the present embodiment, the signal lines SL and the conductive structures 170 may belong to the same film, that is, the signal lines SL and the conductive structures 170 may be formed by the same material.

In addition, in the present embodiment, the display apparatus 100d comprises an insulation layer 180 disposed on the array substrate 110, and the insulation layer 180 can provide a flattening function. The material of the insulation layer 180, for example, may be (but is not limited to): an inorganic material, an organic material, or a combination thereof, where the inorganic material, for example, is (but is not limited to): silicon oxide, silicon nitride, silicon oxynitride, or a stack layer of the foregoing at least two materials; the organic material, for example, is (but is not limited to): a macromolecular material, such as polyimide resin, epoxy resin, or acrylic resin.

In addition, in the present embodiment, the display apparatus 100d comprises a plurality of conductive structures 190, disposed on the insulation layer 180 and arranged in an array corresponding to the light emitting units U. In detail, in the present embodiment, the conductive structures 190 are electrically connected to the electrodes 126d of the light emitting elements 120d and may be electrically connected to corresponding signal lines SL via a contact window opening O provided in the insulation layer 180. That is, in the present embodiment, one conductive structure 190 is electrically connected to one light emitting unit U, and one signal line SL is electrically connected to one conductive structure 190. On the other hand, the material of the conductive structures 190, for example, is (but is not limited to): copper, titanium, nickel, silver, gold, indium, or another suitable conductive material.

It is worth mentioning that, in the present embodiment, the conductive structure 190 not only can be used as a display electrode, but also can be used as a touch electrode. That is, in the present embodiment, the conductive structure 190 has a touch function. In detail, in the present embodiment, the signal lines SL, for example, may be electrically connected to a ground circuit or a common circuit to receive a common voltage, or electrically connected to a touch circuit. When the signal lines SL are electrically connected to the ground circuit or the common circuit, a charge guide path is formed, so that a display signal is generated when a display panel 100*d* performs a display operation; when the signal line SL is electrically connected to the touch circuit, a touch signal is generated when the display panel 100*d* performs a touch operation. That is, in the present embodiment, the display panel 100*d* may have display and touch functions.

From another point of view, in the present embodiment, because one signal line SL is electrically connected to one conductive structure 190, transmission and reception of the capacitive touch signal corresponding to one conductive structure 190 are performed via the same signal line SL. That is, the display panel 100*d* performs a touch detection action in a self-capacitive touch detection structure.

In addition, in the present embodiment, each of the light emitting units U comprises two light emitting elements 120*d* electrically connected to each other, so that the display apparatus 100*d* can provide a good repair function, thereby improving the product utility rate.

In addition, although FIG. 4 discloses four light emitting units U, any person of ordinary skill in the art should understand that, the display panel 100*d* may comprise a plurality of, for example, two, three, five, or more, light emitting units U arranged on the array substrate 110 in arrays. On the other hand, in other embodiments, the display apparatus 100*d* may also have only one light emitting unit U.

In addition, although in the foregoing embodiments of FIG. 4 and FIG. 5, one light emitting unit U comprises two light emitting units 120*d*, the present disclosure is not limited thereto. That is, one light emitting unit U may comprise one light emitting element 120*d* or a plurality of light emitting elements 120*d*.

In addition, although in the foregoing embodiments of FIG. 4 and FIG. 5, the display panel 100*d* performs a touch detection action in a self-capacitive touch detection structure, the present disclosure is not limited thereto. In other embodiments, the display panel of the present disclosure may also perform a touch detection action in a mutual-capacitive touch detection structure. Detailed description will be made below with reference to FIG. 6 and FIG. 7. It must be described herein that the following embodiments still use reference numbers and partial content of the foregoing embodiments; same or similar reference numbers are used to represent same or similar elements, and descriptions of same technical content are omitted. Refer to the foregoing embodiments for descriptions of the omitted part, which is not described again in the foregoing embodiments.

Figure 6:
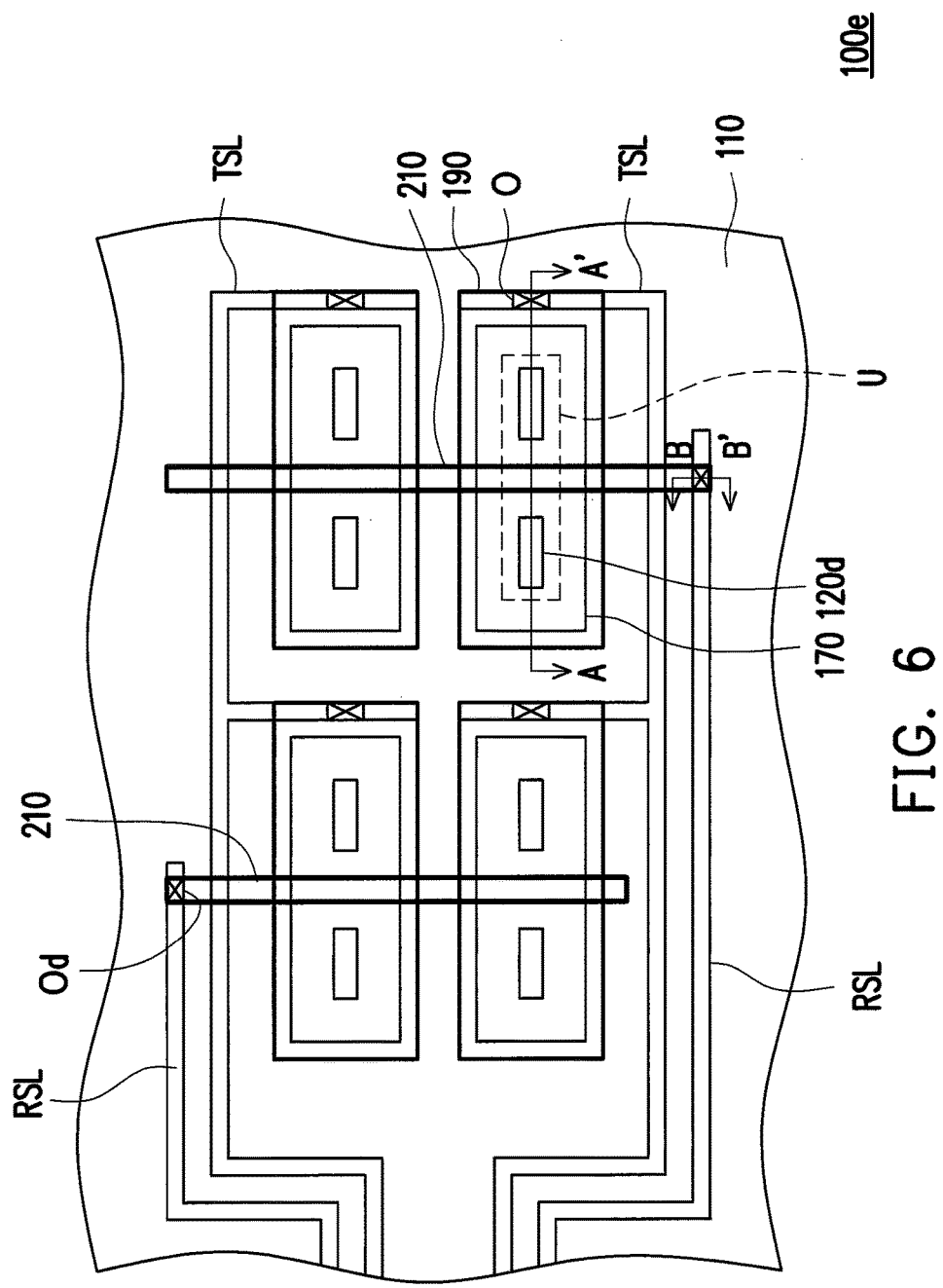
FIG. 6 is a schematic top view of a part of a display apparatus of a fifth embodiment of the present disclosure.
Figure 7:
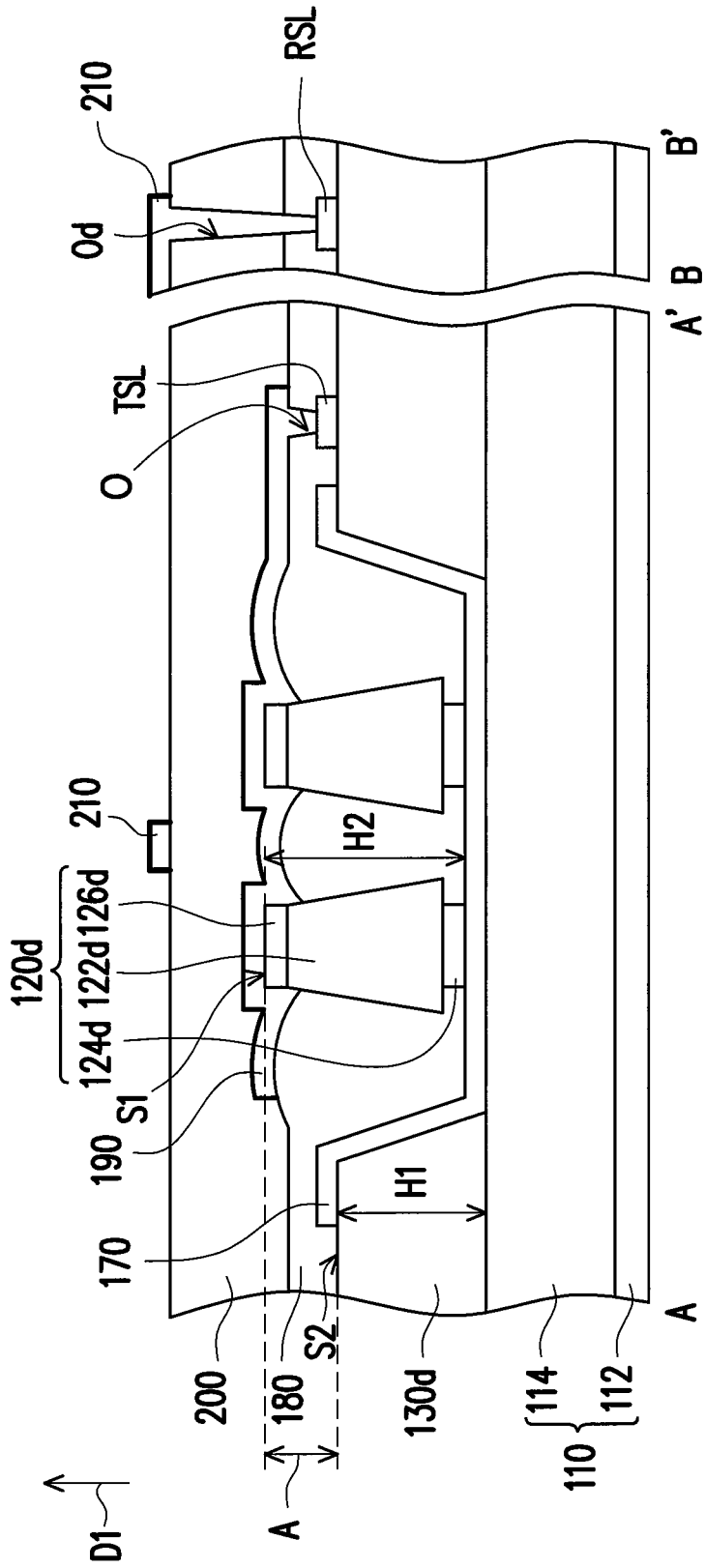
FIG. 7 is a schematic cross-sectional view along a section line A-A' and a section line B-B' in FIG. 6.

FIG. 6 is a schematic top view of a part of a display apparatus of a fifth embodiment of the present disclosure. FIG. 7 is a schematic cross-sectional view along a section line A-A' and a section line B-B' in FIG. 6. Referring to FIG. 6 and FIG. 4, a display apparatus 100*e* of the present embodiment is similar to the display apparatus 100*d* of FIG. 4, and the difference mainly lies in a layout manner of signal lines. Therefore, differences therebetween will be described below.

Referring to FIG. 6 and FIG. 7 at the same time, the display apparatus 100*e* comprises a plurality of drive signal lines TSL, disposed on the BM 130*d*. In detail, in the present embodiment, conductive structures 190 located in the same row are electrically connected to a corresponding drive signal line TSL via the contact window opening O provided in the insulation layer 180. That is to say, in the present embodiment, one drive signal line TSL is electrically connected to the conductive structures 190 located in the same row, that is, one drive signal line TSL is electrically connected to light emitting units U located in the same row. From another point of view, in the present embodiment, a quantity of the drive signal lines TSL may correspond to a quantity of rows of an array formed by the light emitting units U.

On the other hand, as stated above, the conductive structure 190 not only can be used as a display electrode, but also can be used as a touch electrode. Therefore, in the present embodiment, the drive signal line TSL, for example, may be electrically connected to a ground circuit, or a common circuit, or electrically connected to a drive touch circuit. When the drive signal line TSL is electrically connected to the ground circuit or the common circuit, a charge guide path is formed, so that a display signal is generated when a display panel 100*e* performs a display operation; when the drive signal line TSL is electrically connected to the drive touch circuit, the drive signal line TSL can be configured to transmit a touch drive signal to the conductive structure 190 when the display panel 100*e* performs a touch operation. That is, in the present embodiment, the conductive structure 190 is used as a touch drive electrode.

In addition, in the present embodiment, the display apparatus 100*e* comprises a plurality of received signal lines RSL, disposed on the BM 130*d*. In detail, in the present embodiment, the received signal line RSL is set corresponding to the light emitting units U located in the same column. That is, in the present embodiment, a quantity of the received signal lines RSL may correspond to a quantity of columns of an array formed by the light emitting units U. In addition, in the present embodiment, the received signal lines RSL, the drive signal lines TSL, and the conductive structures 190 may belong to the same film, that is, the received signal line RSL, the drive signal line TSL, and the conductive structure 190 may be formed by the same material.

In addition, in the present embodiment, the display apparatus 100*e* comprises an insulation layer 200, disposed on the array substrate 110 and covering the light emitting elements 120*d*. The material of the insulation layer 200, for example, may be (but is not limited to): an inorganic material, an organic material, or a combination thereof, where the inorganic material, for example, is (but is not limited to): silicon oxide, silicon nitride, silicon oxynitride, or a stack layer of the foregoing at least two materials; the organic material, for example, is (but is not limited to): a macromolecular material, such as polyimide resin, epoxy resin, or acrylic resin.

In addition, in the present embodiment, the display apparatus 100*e* comprises a plurality of conductive structures 210, disposed on the insulation layer 200. In detail, in the present embodiment, the conductive structure 210 is set corresponding to the light emitting units U located in the same column and is electrically connected to a corresponding received signal line RSL via a contact window opening Od provided in the insulation layer 200. That is, in the present embodiment, a quantity of the conductive structures 210 may correspond to a quantity of columns of an array formed by the light emitting units U, and one conductive structure 210 is electrically connected to one received signal line RSL. In addition, the material of the conductive structures 210, for example, is (but is not limited to): copper, titanium, nickel, silver, gold, indium, or another suitable conductive material.

From another point of view, in the present embodiment, the conductive structures 210 are overlapped with the conductive structures 190 located in the same column. In this way, in the case that the received signal line RSL is electrically connected to a receiving touch circuit, when the display panel 100e performs a touch operation, the received signal lines RSL can receive a capacitance change signal between the conductive structure 190 and the conductive structure 210, to further made a back-end control circuit (not drawn) determine whether touch occurs. That is, in the present embodiment, the conductive structure 210 may be used as a touch receiving electrode.

In addition, in the embodiments of FIG. 4, FIG. 5, FIG. 6, and FIG. 7, the conductive structure 190 is used as the display electrode and the touch electrode at the same time, but the present disclosure is not limited thereto. In other embodiments, the conductive structure 190 may be used as the display electrode only. Detailed description will be made below according to FIG. 8 to FIG. 11. It must be described herein that the following embodiments still use reference numbers and partial content of the foregoing embodiments; same or similar reference numbers are used to represent same or similar elements, and descriptions of same technical content are omitted. Refer to the foregoing embodiments for descriptions of the omitted part, which is not described again in the foregoing embodiments.

Figure 8:
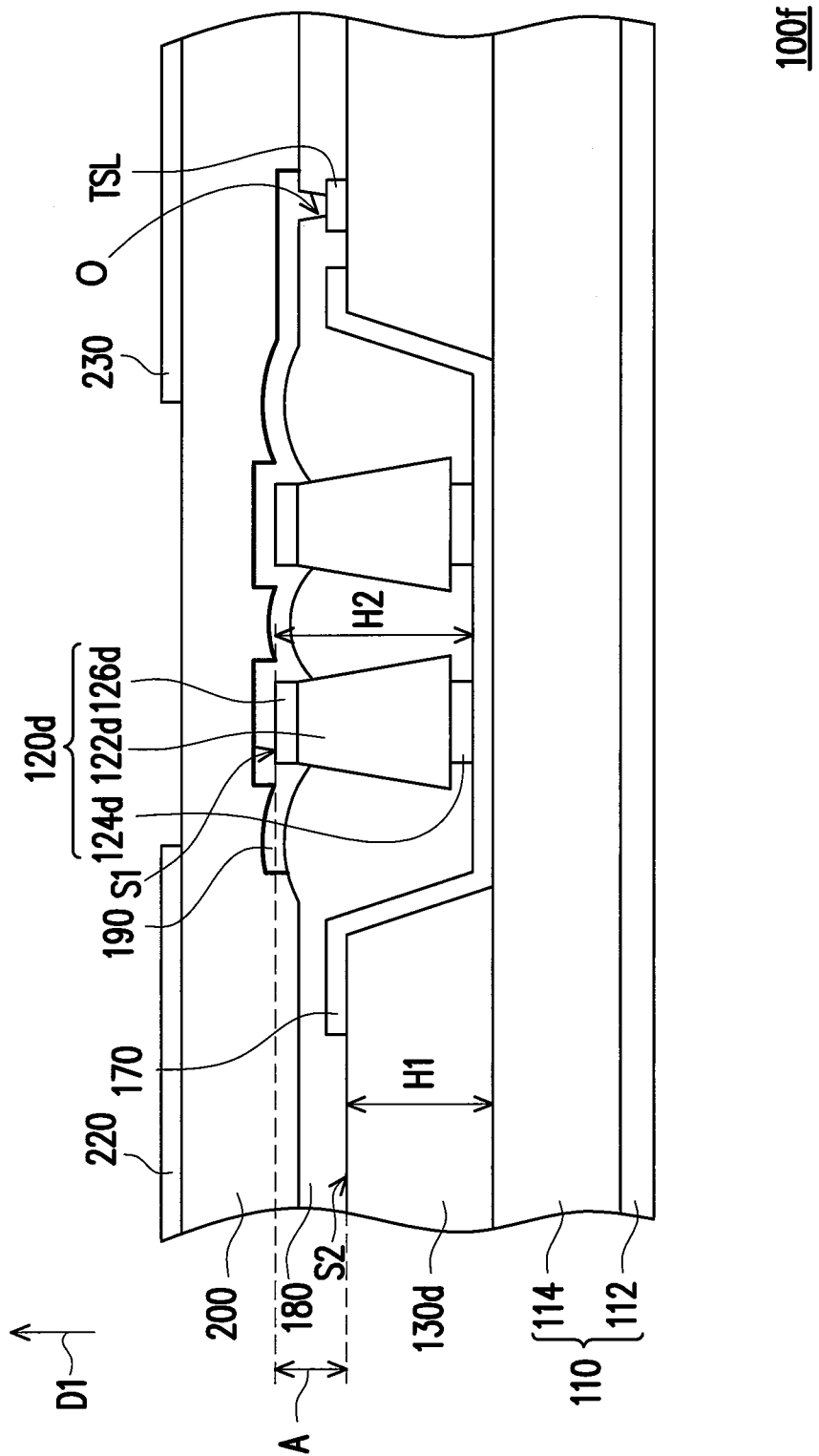
FIG. 8 is a schematic cross-sectional view of a part of a display apparatus of a sixth embodiment of the present disclosure.

FIG. 8 is a schematic cross-sectional view of a part of a display apparatus of a sixth embodiment of the present disclosure. Referring to FIG. 8 and FIG. 7, a display apparatus 100f of the present embodiment is similar to the display apparatus 100e of FIG. 7, and therefore differences therebetween will be described below.

Referring to FIG. 8, the display apparatus 100f comprises a touch structure disposed on an insulation layer 200. The touch structure comprises a conductive structure 220 and a conductive structure 230. In the present embodiment, materials of the conductive structure 220 and the conductive structure 230, for example, are (but are not limited to): copper, titanium, nickel, silver, gold, indium, or other suitable conductive materials. In the present embodiment, the conductive structure 220 and the conductive structure 230, for example, are formed in the same lithography etching process.

It is worth describing that in the present embodiment, one of the conductive structure 220 and the conductive structure 230 is used as a touch drive electrode, and the other one is used as a touch receiving electrode. This indicates that in the present embodiment, the conductive structure 190 is used as a display electrode only, and the conductive structure 220 and the conductive structure 230 are respectively used as touch electrodes. That is, in the present embodiment, the conductive structure 190 does not have a touch function, and the conductive structure 220 and the conductive structure 230 have touch functions. In this way, in the present embodiment, the display panel 100f may have display and touch functions. From another point of view, in the present embodiment, the conductive structure 220 and the conductive structure 230 form a single-sided touch electrode layer together.

Figure 9:
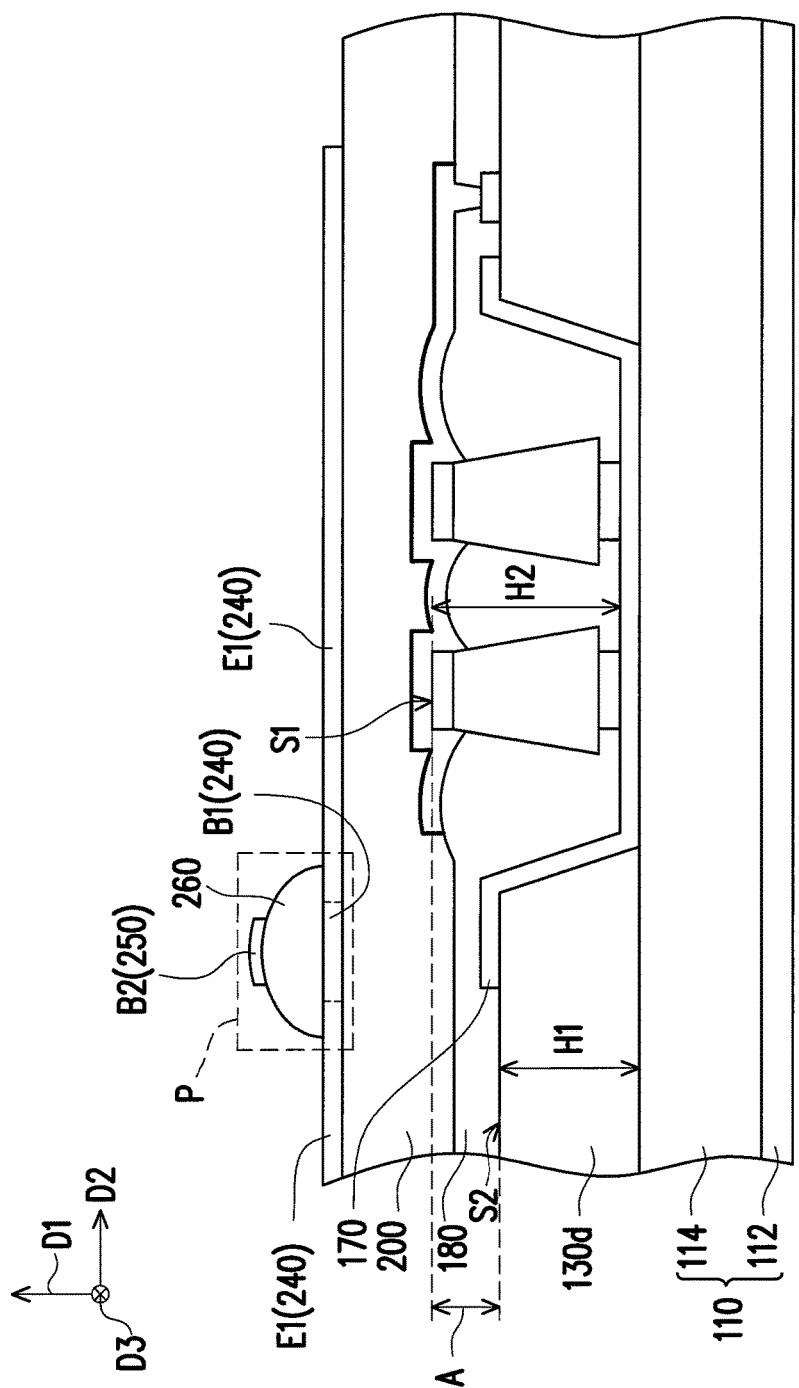
FIG. 9 is schematic cross-sectional view of a part of a display apparatus of a seventh embodiment of the present disclosure.

FIG. 9 is a schematic cross-sectional view of a part of a display apparatus of a seventh embodiment of the present disclosure. Referring to FIG. 9 and FIG. 7, a display apparatus 100g of the present embodiment is similar to the display apparatus 100e of FIG. 7, and therefore differences therebetween will be described below.

Referring to FIG. 9, the display apparatus 100g comprises a touch structure disposed on an insulation layer 200. The touch structure comprises a conductive structure 240 and a conductive structure 250. In detail, in the present embodiment, the conductive structure 240 and the conductive structure 250 are electrically independent from each other. The conductive structure 240 intersects with the conductive structure 250 to form a plurality of intersections P; the conductive structure 240 is a sensing electrode serial that extends a long a direction D2 that intersects with a direction D1, and the conductive structure 250 is a sensing electrode serial along a direction D3 that intersects with the direction D1. More specifically, in the present embodiment, the conductive structure 240 comprises a plurality of first sensing electrodes E1 and a plurality of first bridging lines B1 that connect the first sensing electrodes E1 into a string, and the conductive structure 250 comprises a plurality of second sensing electrodes (not drawn) and a plurality of second bridging lines B2 that connect the second sensing electrodes into a string. It is worth mentioning that, for ease of description, only two first sensing electrodes E1, one first bridging line B1 that are connected to the two first sensing electrodes E1, one second bridging line B2, and one intersection P are drawn in FIG. 9. However, any person of ordinary skill in the art should understand that, the conductive structure 240 generally comprises a plurality of first sensing electrodes E1 arranged in an array and a plurality of first bridging lines B1 that connect the plurality of first sensing electrodes E1 into a string, and the conductive structure 250 generally comprises a plurality of second sensing electrodes arranged in an array and a plurality of second bridging lines B2 that connect the plurality of second sensing electrodes into a string, and the conductive structure 240 intersects with the conductive structure 250 to form a plurality of intersections P.

Further, in the present embodiment, the first sensing electrodes E1, the first bridging lines B1, and the second sensing electrodes are formed on the insulation layer 200, and the first sensing electrodes E1, the first bridging lines B1, and the second sensing electrodes, for example, are formed in the same lithography etching process. In the present embodiment, to prevent the conductive structure 240 from getting in electric contact with the conductive structure 250, an insulation pattern 260 is formed at the intersection P to separate the conductive structure 240 from the conductive structure 250. In detail, in the present embodiment, the second bridging lines B2 are formed on the insulation pattern 260. In the present embodiment, materials of the first sensing electrode E1, the first bridging line B1, and the second sensing electrode, for example, are (but are not limited to): indium tin oxide (ITO), silver nanowires, metal grids, conductive macromolecules, carbon nanotubes, grapheme, or other suitable conductive materials; the material of the second bridging line B2, for example, is (but is not limited to): copper, aluminum, molybdenum, titanium, nickel, silver, or another suitable conductive material; the material of the insulation pattern 260, for example, may be (but is not limited to): an inorganic material, an organic material, or a combination thereof, where the inorganic material, for example, is (but is not limited to): silicon oxide, silicon nitride, silicon oxynitride, or a stack layer of the foregoing at least two materials; the organic material, for example, is (but is not limited to): a macromolecular material, such as polyimide resin, epoxy resin, or acrylic resin.

It is worth describing that in the present embodiment, the conductive structure 240 is used as a touch drive electrode, and the conductive structure 250 is used as a touch receiving electrode. This indicates that in the present embodiment, the conductive structure 190 is used as a display electrode only, and the conductive structure 240 and the conductive structure 250 are respectively used as touch electrodes. That is, in the present embodiment, the conductive structure 190 does not have a touch function, and the conductive structure 240 and the conductive structure 250 have touch functions. In this way, in the present embodiment, the display panel 100g may have display and touch functions. From another point of view, in the present embodiment, the conductive structure 240 and the conductive structure 250 form a single-layer touch electrode layer together.

Figure 10:
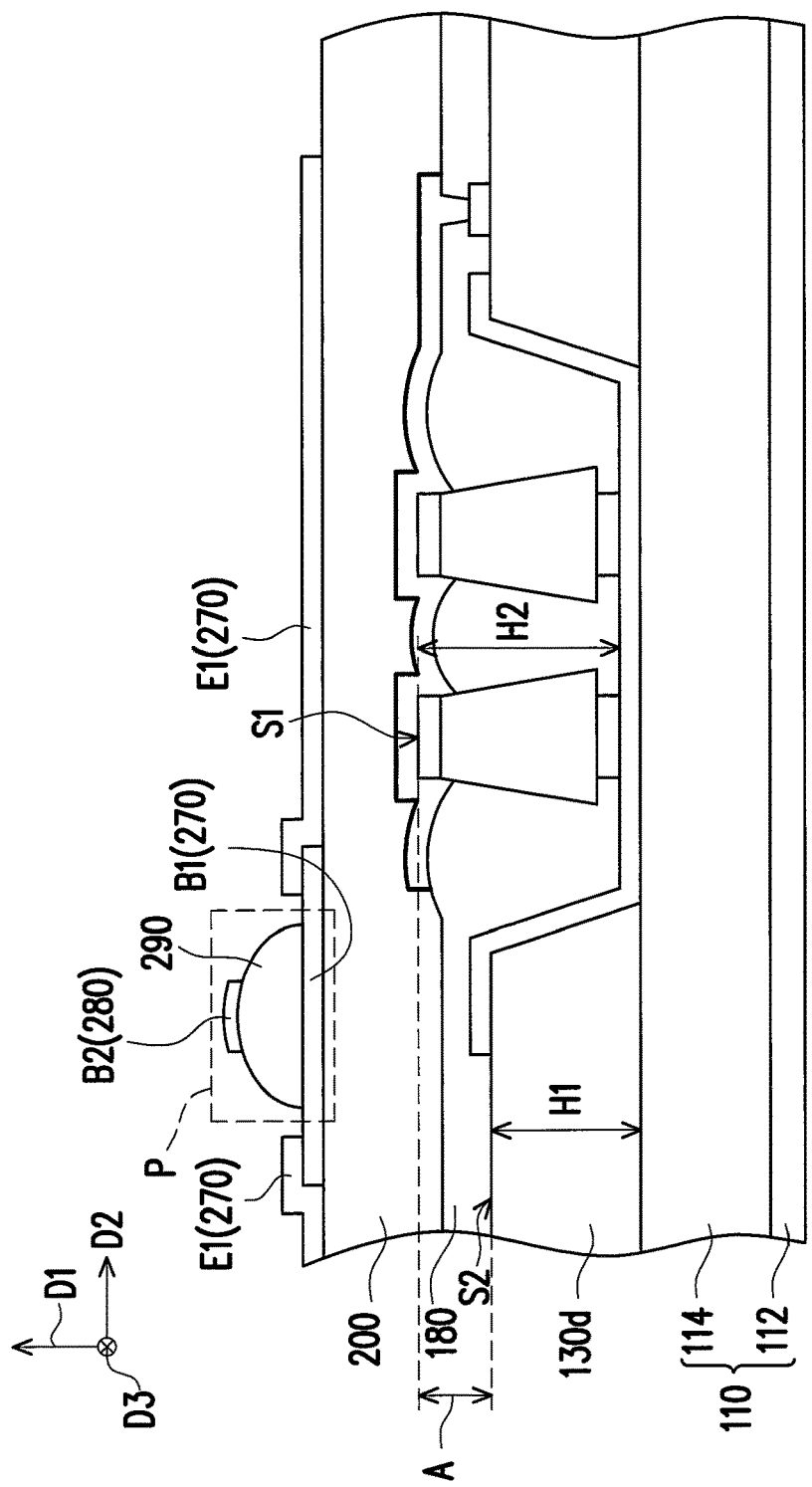
FIG. 10 is a schematic cross-sectional view of a part of a display apparatus of an eighth embodiment of the present disclosure.

FIG. 10 is a schematic cross-sectional view of a part of a display apparatus of an eighth embodiment of the present disclosure. Referring to FIG. 10 and FIG. 7, a display apparatus 100h of the present embodiment is similar to the display apparatus 100e of FIG. 7, and therefore differences therebetween will be described below.

Referring to FIG. 10, the display apparatus 100h comprises a touch structure disposed on an insulation layer 200. The touch structure comprises a conductive structure 270 and a conductive structure 280. In detail, in the present embodiment, the conductive structure 270 and the conductive structure 280 are electrically independent from each other. The conductive structure 270 intersects with the conductive structure 280 to form a plurality of intersections P; the conductive structure 270 is a sensing electrode serial that extends a long a direction D2 that intersects with a direction D1, and the conductive structure 280 is a sensing electrode serial along a direction D3 that intersects with the direction D1. More specifically, in the present embodiment, the conductive structure 270 comprises a plurality of first sensing electrodes E1 and a plurality of first bridging lines B1 that connect the first sensing electrodes E1 into a string, and the conductive structure 280 comprises a plurality of second sensing electrodes (not drawn) and a plurality of second bridging lines B2 that connect the second sensing electrodes into a string. It is worth mentioning that, for ease of description, only two first sensing electrodes E1, one first bridging line B1 that are connected to the two first sensing electrodes E1, one second bridging line B2, and one intersection P are drawn in FIG. 10. However, any person of ordinary skill in the art should understand that, the conductive structure 270 generally comprises a plurality of first sensing electrodes E1 arranged in an array and a plurality of first bridging lines B1 that connect the plurality of first sensing electrodes E1 into a string, and the conductive structure 280 generally comprises a plurality of second sensing electrodes arranged in an array and a plurality of second bridging lines B2 that connect the plurality of second sensing electrodes into a string, and the conductive structure 270 intersects with the conductive structure 280 to form a plurality of intersections P.

Further, in the present embodiment, to prevent the conductive structure 270 from getting in electric contact with the conductive structure 280, an insulation pattern 290 is formed at the intersection P to separate the conductive structure 270 from the conductive structure 280. In the present embodiment, the first sensing electrodes E1, the second sensing electrodes, and the second bridging lines B2, for example, are formed in the same lithography etching process. The first sensing electrodes E1 and the second sensing electrodes are formed on the insulation layer 200, and the second bridging lines B2 are formed on the insulation pattern 290. In the present embodiment, the first bridging lines B1 are disposed between the insulation layer 200 and the insulation pattern 290. In detail, in the present embodiment, the insulation pattern 290 is formed on the first bridging lines B1 and the second bridging lines B2 are formed on the insulation pattern 290, so that the insulation pattern 290 prevents the first bridging lines B1 from getting in electric contact with the second bridging lines B2. In the present embodiment, materials of the first sensing electrode E1, the second sensing electrode, and the second bridging line B2, for example, are (but are not limited to): ITO, silver nanowires, metal grids, conductive macromolecules, carbon nanotubes, grapheme, or other suitable conductive materials; the material of the first bridging line B1, for example, is (but is not limited to): copper, aluminum, molybdenum, titanium, nickel, silver, or another suitable conductive material; the material of the insulation pattern 290, for example, may be (but is not limited to): an inorganic material, an organic material, or a combination thereof, where the inorganic material, for example, is (but is not limited to): silicon oxide, silicon nitride, silicon oxynitride, or a stack layer of the foregoing at least two materials; the organic material, for example, is (but is not limited to): a macromolecular material, such as polyimide resin, epoxy resin, or acrylic resin.

It is worth describing that in the present embodiment, the conductive structure 270 is used as a touch drive electrode, and the conductive structure 280 is used as a touch receiving electrode. This indicates that in the present embodiment, the conductive structure 190 is used as a display electrode only, and the conductive structure 270 and the conductive structure 280 are respectively used as touch electrodes. That is, in the present embodiment, the conductive structure 190 does not have a touch function, and the conductive structure 270 and the conductive structure 280 have touch functions. In this way, in the present embodiment, the display panel 100h may have display and touch functions. From another point of view, in the present embodiment, the conductive structure 270 and the conductive structure 280 form a single-layer touch electrode layer together.

Figure 11:
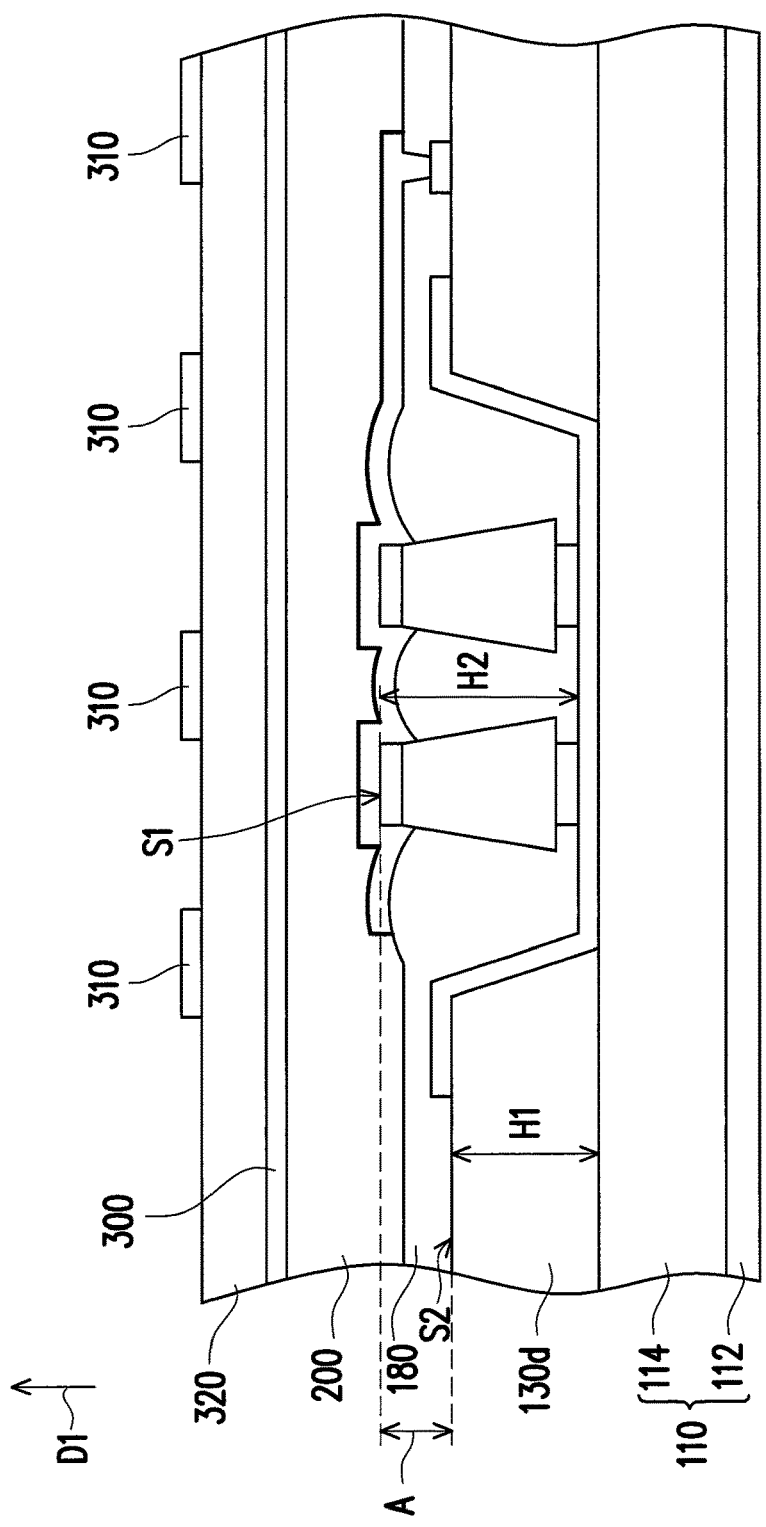
FIG. 11 is a schematic cross-sectional view of a part of a display apparatus of a ninth embodiment of the present disclosure.

FIG. 11 is a schematic cross-sectional view of a part of a display apparatus of a ninth embodiment of the present disclosure. Referring to FIG. 11 and FIG. 7, a display apparatus 100i of the present embodiment is similar to the display apparatus 100e of FIG. 7, and therefore differences therebetween will be described below.

Referring to FIG. 11, the display apparatus 100i comprises a touch structure disposed on an insulation layer 200. The touch structure comprises a conductive structure 300 and a conductive structure 310. In detail, in the present embodiment, an insulation layer 320 is disposed between the conductive structure 300 and the conductive structure 310. In the present embodiment, materials of the conductive structure 300 and the conductive structure 310, for example, are (but are not limited to): copper, titanium, nickel, silver, gold, indium, or other suitable conductive materials; the material of the insulation layer 320, for example, may be (but is not limited to): an inorganic material, an organic material, or a combination thereof, where the inorganic material, for example, is (but is not limited to): silicon oxide, silicon nitride, silicon oxynitride, or a stack layer of the foregoing at least two materials; the organic material, for example, is (but is not limited to): a macromolecular material, such as polyimide resin, epoxy resin, or acrylic resin.

It is worth describing that in the present embodiment, the conductive structure 300 is used as a touch drive electrode, and the conductive structure 310 is used as a touch receiving electrode. This indicates that in the present embodiment, the conductive structure 190 is used as a display electrode only, and the conductive structure 300 and the conductive structure 310 are respectively used as touch electrodes. That is, in the present embodiment, the conductive structure 190 does not have a touch function, and the conductive structure 300 and the conductive structure 310 have touch functions. In this way, in the present embodiment, the display panel 100i may have display and touch functions. From another point of view, in the present embodiment, the conductive structure 300 and the conductive structure 310 form a double-sided touch electrode layer together.

In addition, although in the embodiments of FIG. 8 to FIG. 11, the display apparatuses 100f to 100i do not comprise an opposite substrate, the present disclosure is not limited thereto. In other embodiments, the display apparatuses 100f to 100i may also comprise an opposite substrate paired with the array substrate 110. The opposite substrate may be implemented by the opposite substrate 140 of FIG. 1, or may be any opposite substrate well known to any person of ordinary skill in the art. In embodiments in which an opposite substrate is comprised, the foregoing touch structure is formed on the opposite substrate.

Based on the above, in the display apparatus of the present disclosure, a height H1 of a light shielding layer disposed on a periphery of light emitting elements and a height H2 of the light emitting elements satisfy the following relations: $\frac{1}{2} \times H2 \leq H1 \leq H2+5$ μm or $\frac{1}{2} \times H2 \leq H1 \leq 2 \times H2$, or in a direction perpendicular to an array substrate, there is a distance between 0 and 5 μm between an upper surface of the light emitting elements and an upper surface of the light shielding layer, so that light with different colors emitted by adjacent light emitting elements does not interfere with each other, and therefore the color mixing problem is avoided. In addition, in the display apparatus of the present disclosure, by setting an optical seal layer between an array substrate and an opposite substrate, the problem that a transmittance of light emitted by the light emitting elements is decreased caused by a poor refractive index between air and wavelength conversion patterns can be avoided. In addition, in the display apparatus of the present disclosure, a display electrode is also used as a touch electrode, so that the display apparatus may have display and touch functions.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A display apparatus, comprising:
   an array substrate;
   a light emitting element, disposed on the array substrate, wherein the light emitting element comprises a first upper surface;
   a light shielding layer, disposed on a periphery of the light emitting element, wherein the light shielding layer comprises a second upper surface; and
   a first conductive structure, disposed on the light emitting element, wherein
   the light emitting element comprises a first electrode and a second electrode, the first conductive structure has a touch function, and the first electrode is directly connected to the first conductive structure, and
   a distance between the first upper surface and the second upper surface in a direction perpendicular to the array substrate is between 0 and 5 μm.

2. The display apparatus according to claim 1, wherein the distance is between 0 and 3 μm.

3. The display apparatus according to claim 1, further comprising:
   an opposite substrate, disposed on the array substrate, wherein the light shielding layer is disposed between the array substrate and the opposite substrate.

4. The display apparatus according to claim 1, wherein the light shielding layer is an insulating material.

5. The display apparatus according to claim 1,
   wherein the first conductive structure has a touch function.

6. The display apparatus according to claim 5, further comprising:
   an insulation layer, disposed on the first conductive structure; and
   a second conductive structure, disposed on the insulation layer and overlapping with the first conductive structure, wherein the second conductive structure has a touch function.

7. The display apparatus according to claim 1, further comprising:
   a first insulation layer, disposed on the first conductive structure;
   a second conductive structure, disposed on the first insulation layer; and
   a third conductive structure, disposed on the first insulation layer, wherein the second conductive structure and the third conductive structure have touch functions.

8. The display apparatus according to claim 7, wherein the second conductive structure and the third conductive structure form a single-sided touch electrode layer.

9. The display apparatus according to claim 7, wherein the second conductive structure and the third conductive structure are electrically independent.

10. The display apparatus according to claim 7, wherein the second conductive structure and the third conductive structure form a double-sided touch electrode layer.

11. The display apparatus according to claim 7, further comprising a second insulation layer, disposed between the second conductive structure and the third conductive structure.

12. The display apparatus according to claim 3, wherein the light shielding layer is a filling material, and an optical density of the filling material is between 0 density/μm to 5 density/μm.

13. The display apparatus according to claim 12, further comprising:
   an optical seal layer, disposed between the array substrate and the opposite substrate, and covering the light emitting element.

14. The display apparatus according to claim 13, wherein a thickness of the optical seal layer is between 2 μm and 20 μm.

15. The display apparatus according to claim 3, wherein the light shielding layer is a metal layer, and the display apparatus further comprises an insulation layer, disposed between the metal layer and the light emitting element.

16. The display apparatus according to claim 15, further comprising:

an optical seal layer, disposed between the array substrate and the opposite substrate, and covering the light emitting element.

17. The display apparatus according to claim 16, wherein a thickness of the optical seal layer is between 2 µm and 20 µm.

18. The display apparatus according to claim 5, further comprising:
a signal line, electrically connected to the first conductive structure, wherein the first conductive structure receives a common voltage by means of the signal line.

19. The display apparatus according to claim 1, further comprising:
an opposite substrate, disposed on the first conductive structure;
a second conductive structure, disposed on the opposite substrate; and
a third conductive structure, disposed on the opposite substrate, wherein the second conductive structure and the third conductive structure have touch functions.

20. The display apparatus according to claim 19, wherein the second conductive structure and the third conductive structure form a single-sided touch electrode layer or a double-sided touch electrode layer.

* * * * *